United States Patent
Kim

(10) Patent No.: US 7,552,158 B2
(45) Date of Patent: Jun. 23, 2009

(54) DIGITAL FILTER AND DIGITAL BROADCASTING RECEIVER HAVING THE SAME

(75) Inventor: Woo Chan Kim, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 1088 days.

(21) Appl. No.: 11/029,422

(22) Filed: Jan. 6, 2005

(65) Prior Publication Data

US 2005/0154772 A1  Jul. 14, 2005

(30) Foreign Application Priority Data

Jan. 9, 2004  (KR) ...................... 10-2004-0001681

(51) Int. Cl.
*G06F 17/10* (2006.01)
(52) U.S. Cl. ...................................... 708/322
(58) Field of Classification Search ................. None
See application file for complete search history.

(56) References Cited

U.S. PATENT DOCUMENTS

| | | | | | |
|---|---|---|---|---|---|
| 5,467,370 A | * | 11/1995 | Yamasaki et al. | ............ | 375/232 |
| 5,642,382 A | * | 6/1997 | Juan | ............................ | 375/232 |
| 5,831,879 A | * | 11/1998 | Yom et al. | .................... | 708/301 |
| 5,907,497 A | * | 5/1999 | Raghunath | .................... | 708/323 |
| 6,108,681 A | * | 8/2000 | Wittig et al. | ................. | 708/319 |
| 6,396,548 B1 | * | 5/2002 | Gornstein et al. | ............ | 348/725 |
| 6,665,696 B2 | * | 12/2003 | Brokish | ....................... | 708/322 |
| 7,408,983 B2 | * | 8/2008 | Kim | ............................ | 375/232 |
| 2005/0050127 A1 | * | 3/2005 | Kim | ............................ | 708/322 |

* cited by examiner

*Primary Examiner*—David H Malzahn
(74) *Attorney, Agent, or Firm*—Birch, Stewart, Kolash & Birch, LLP

(57) ABSTRACT

The present invention relates to a digital filter capable of computing a tap without output delay due to the filter operation in a symbol time, and a digital broadcasting receiver having the same. Particularly, filter output is obtained within a clock period, one multiplier and one adder are used to perform coefficient update for a plurality of taps, and the multiplier performs the output operation for each tap, whereby the number of multipliers and adders is reduced inversely proportional to the number of taps being operated for one clock period. Thus, the digital filter of the present invention can be very advantageously used for resolving the filter size problem in multi-tap filters.

18 Claims, 4 Drawing Sheets

DIGITAL FILTER AND DIGITAL BROADCASTING RECEIVER HAVING THE SAME

This application claims the benefit of the Korean Patent Application No. 10-2004-0001681, filed on Jan. 9, 2004, which is hereby incorporated by reference as if fully set forth herein.

BACKGROUND OF THE INVENTION

1. Field of the Invention

The present invention relates to a digital filter capable of computing a tap without output delay due to the filter operation in a symbol time, and a digital broadcasting receiver having the same.

2. Background of the Related Art

A digital filter based on the LMS (Least Mean Square) adaptive algorithm is a filter capable of updating or adapting coefficients on an ongoing basis. The LMS adaptive digital filter is usually used for an equalizer or a noise eliminator housed in a digital broadcasting receiver, in order to compensate the distortions generated by a channel or a system itself.

The LMS adaptive digital filter includes a multiplier and an adder for the coefficient adaptation for each tap, and an additional multiplier for the output (filtering).

FIG. 1 illustrates the general structure of an LMS adaptive filter, more particularly, a 2-tap LMS adaptive filter. As shown in FIG. 1, the LMS adaptive filter includes four serial delays D11, D12, D21 and D22, D11 and D12 for delaying an input signal x0 in sequence and D21 and D22 for delaying a delayed input signal xd0, and a first and a second coefficient updating unit 10, 20.

Each of the delays D11, D12, D21 and D22 operates according to a clock (clk) signal, and a first and a second tap, i.e., the first and the second coefficient updating unit 10, 20 have the identical structure.

Here, the input signal x0 is outputted to the delay D11 and at the same time to a multiplier 14 of the first coefficient updating unit 10. The delay D11 delays the input signal x0 by one clock, and outputs the one-clock-cycle delayed signal to the delay D12 and a multiplier 24 of the second coefficient updating unit 20 at the same time.

The delayed input signal xd0 is simultaneously outputted to the delay D21 and a multiplier 11 of the first coefficient updating unit 10. The delay D21 delays the delayed input signal xd0 by one clock, and outputs the delayed signal simultaneously to the delay D22 and a multiplier 21 of the second coefficient updating unit 20. The delay D12 delays the delayed signal x1, which was delayed by the delay D11, by one clock before outputting the signal. The delays D22 delays the delayed signal xd1, which was delayed by the delay D21, by one clock before outputting the signal.

The multiplier 11 of the first coefficient updating unit 10 multiplies the delayed input signal xd0 by a feedback error signal e, and outputs the result to an adder 12. The adder 12 adds an old coefficient c0 to the output from the multiplier 11 for the coefficient update, and outputs the updated coefficient to a delay 13. The delay 13 delays the updated coefficient in the adder 13 by one clock, and outputs the delayed coefficient to the adder 13 and the multiplier 14. The multiplier 14 then multiplies the output from the delay 13 by the input signal x0 to obtain a first output y0.

The multiplier 21 of the second coefficient updating unit 20 multiplies the delayed input signal xd1 by a feedback error signal e, and outputs the result to an adder 22. The adder 22 adds an old coefficient c0 to the output from the multiplier 21 for the coefficient update, and outputs the updated coefficient to a delay 23. The delay 23 delays the updated coefficient in the adder 23 by one clock, and outputs the delayed coefficient to the adder 23 and the multiplier 24. The multiplier 24 then multiplies the output from the delay 23 by the input signal x1 to obtain a second output y1. That is, the outputs y0 and y1 are obtained by multiplying the input signals (x0, x1) by the coefficients (c0, c1) for each tap, respectively.

Recently long-term fading channels are often found because of temporally distant media like ground wave digital TVs. Thus the fading problem should be resolved to facilitate the broadcast receiving operation. However, to compensate the long-term fading by the temporally distant media a multi-tap equalizer or a noise eliminator.

Unfortunately though, the size of the multi-tap filter is so big that the implementation of the filter becomes difficult.

SUMMARY OF THE INVENTION

Accordingly, the present invention is directed to a digital filter and digital broadcasting receiver having the same that substantially obviates one or more problems due to limitations and disadvantages of the related art.

An object of the present invention is to provide a digital filter and digital broadcasting receiver having the same, in which the number of operators for a plurality of taps is reduced and filter output is obtained within a clock period, whereby the filter size problem found in a related art LMS adaptive filter can be resolved.

Particularly, the present invention is characterized of obtaining filter output within a clock period, using one multiplier and one adder to perform coefficient update for a plurality of taps, wherein the multiplier performs the output operation for each tap, and thereby reducing the number of multipliers and adders inversely proportional to the number of taps being operated for one clock period.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a digital filter, including: a first data input unit for sequentially delaying input data for a clock period, and sequentially and selectively outputting one of the input data and delay values for the calculation of a filter output value; a second data input unit for sequentially delaying a delayed input data for a clock period, and sequentially and selectively outputting one of the input data and delay values for coefficient update; a multiplier for multiplying the data value that is sequentially and selectively outputted from the second data input unit by an error value; a coefficient update unit for sequentially updating a coefficient by adding an output from the multiplier to an old feedback coefficient, storing updated coefficients in each delay that operates synchronously with a clock signal with a phase difference of 1/N period (N is the number of filter taps), and feedbacking a sequentially selected updated coefficient as the old coefficient; and an output unit for multiplying updated coefficients sequentially and selectively outputted from the coefficient update unit by data sequentially and selectively outputted from the first data input unit, storing in each delay which operates synchronously with a clock signal with a phase difference of 1/N period, adding all outputs from the delays for a predetermined summation period, and outputting the summed value.

In the exemplary embodiment, the first data input unit includes: N-number of serial delays for synchronizing the input data with the clk and sequentially delaying the data; a selection part for sequentially selecting, according to a selection signal sel, one of the input data x0 and delay values that are delayed respectively by the N-number of delays, and outputting the selected value to the output unit.

In the exemplary embodiment, the second data input unit includes: N-number of serial delays for synchronizing the delayed input data xd0 with the clk and sequentially delaying the data; a selection part for sequentially selecting, according to a selection signal sel, one of the delayed input data x0 and delay values that are delayed respectively by the N-number of delays, and outputting the selected value to the output unit.

In the exemplary embodiment, the coefficient update unit includes: an adder for adding an output from the multiplier to an old feedback coefficient and thereby, updating the old coefficient; N-number of parallel delays, each operating synchronously with a clock signal clk1~clkN−1, clk with a phase difference of 1/N period and storing the updated coefficient; and a selection part for sequentially selecting, according to a selection signal sel, one of outputs from the N-number of parallel delays, and simultaneously feedbacking the selected value to the adder and outputting the value to the output unit.

In the exemplary embodiment, the output unit includes: a multiplier for multiplying a data value that is sequentially and selectively outputted form the first data input unit by an updated coefficient that is sequentially selectively outputted from the coefficient update unit; N-number of parallel delays, each operating synchronously with a clock signal clk1~clkN−1 with a phase difference of 1/N period, and storing and outputting the multiplication result of the multiplier; and an adder for adding, for the predetermined summation period, outputs from the (N−1)-number of delays and a N-th output value outputted without delay and thereby, obtaining a final output.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

The present invention provides an improved filter architecture computing a plurality of taps within a symbol time by sharing adders and multipliers so that the size of a multi-tap filter can be reduced. The present invention filter is very useful for an LMS adaptive digital filter used in a time domain equalizer or a noise eliminator in a VSB digital television receiver.

Figure 1:
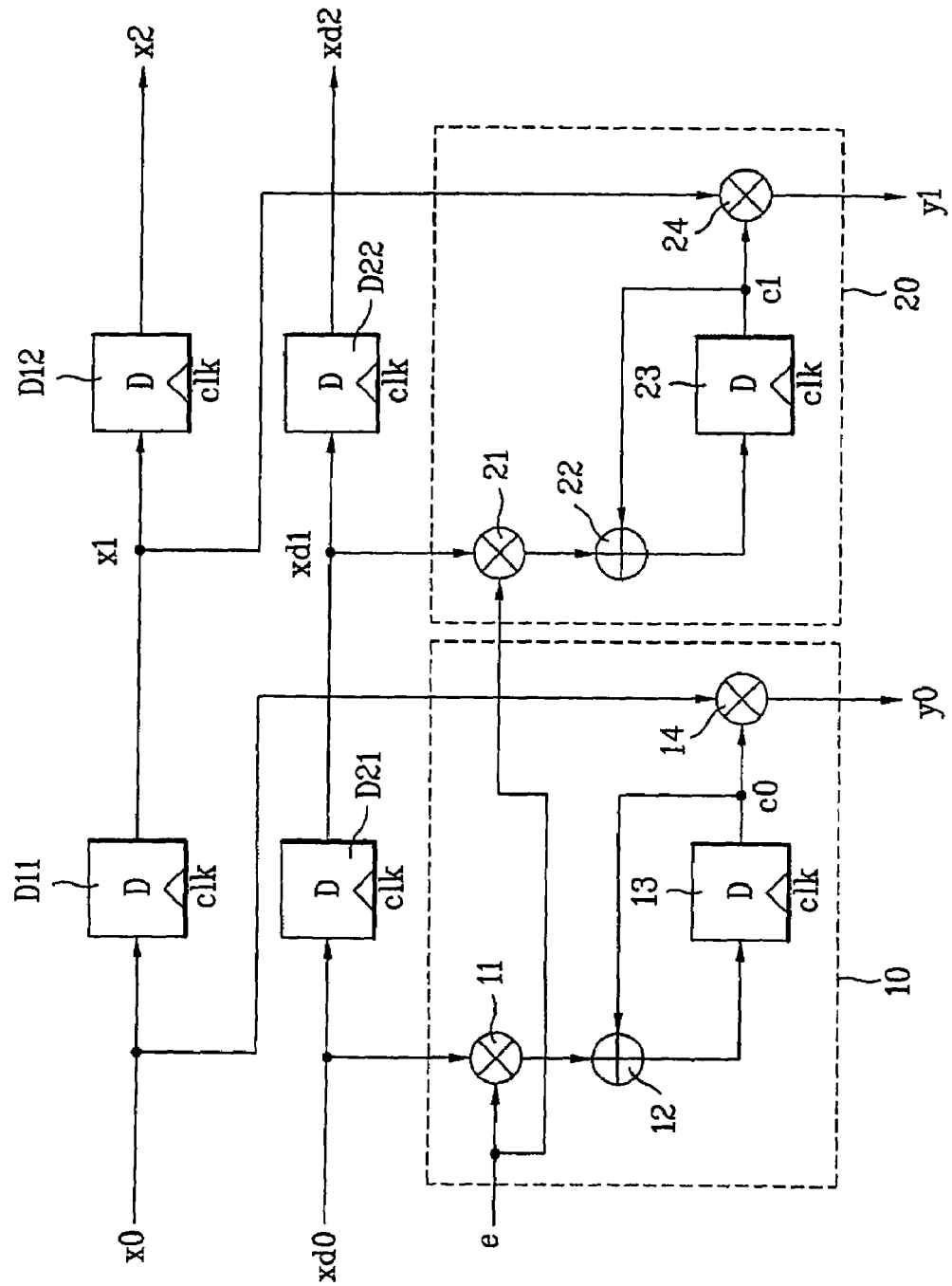
FIG. 1 is a schematic block diagram of a related art 2-tap digital filter.
Figure 2:
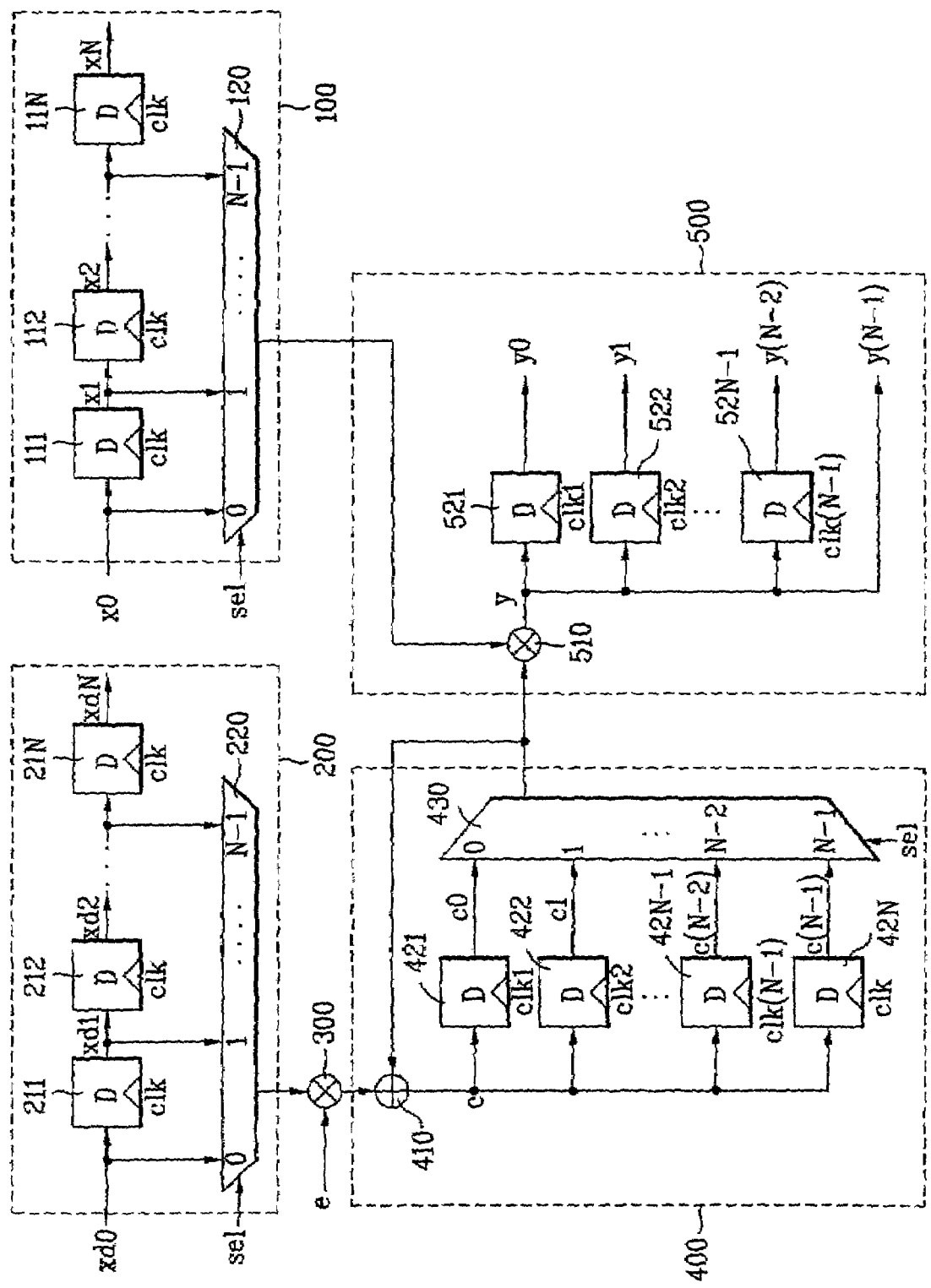
FIG. 2 is a schematic block diagram of an N-tap digital filter according to the present invention.

FIG. 2 is a detailed block diagram of an LMS adaptive digital filter, more particularly an N-tap LMS adaptive digital filter (N is an arbitrary number), according to the present invention.

As shown in FIG. 2, the digital filter includes a first data input unit 100 for delaying input data x0 sequentially, and sequentially and selectively outputting one of the input data x0 and delay values for the calculation of a filter output value; and a second data input unit 200 for delaying a delayed input data xd0 sequentially, and sequentially and selectively outputting one of the input data xd0 and delay values for use with coefficient updating. In addition, the digital filter includes a multiplier 300 for multiplying the data value that is sequentially and selectively outputted from the second data input unit 200 by an error value; a coefficient update unit 400 for updating a coefficient by adding an output from the multiplier 300 to an old feedback coefficient, storing updated coefficients in each delay that operates synchronously with a clock signal with a phase difference of 1/N period, and feedbacking a selected updated coefficient as the old coefficient; and an output unit 500 for multiplying updated coefficients sequentially and selectively outputted from the coefficient update unit 400 by data sequentially and selectively outputted from the first data input unit 100, storing in each delay which operates synchronously with a clock signal with a phase difference of 1/N period, adding all outputs from the delays, and outputting the summed value.

The first data input unit 100 includes N number of serial delays 111-11N operating synchronously with a clock signal clk and sequentially delaying an input data x0; and a selection part 120 for sequentially selecting, according to a selection signal sel, one of the input data x0 and delay values delayed respectively by the delays 111~11N, and outputting the selected value to the output unit 500. The clk is a symbol clock in each clock period.

The second data input unit 200 includes N number of serial delays 211~21N, each operating synchronously with a clock signal clk and sequentially delaying a delayed input data xd0; and a selection part 220 for sequentially selecting, according to the selection signal sel, one of the delayed input data xd0 and delay values delayed respectively by the delays 211~21N, and outputting the selected value to the multiplier 300. The delayed input signal xd0 is generated by delaying the input signal x0 for at least one symbol clock.

The coefficient update unit 400 includes an adder 410 for adding an output from the multiplier 300 to an old feedback coefficient and thereby, updating the old coefficient; N-number of parallel delays 421~42N, each operating synchronously with a clock signal clk1~clkN−1, clk with a phase difference of 1/N period and storing the updated coefficient; and a selection part 430 for sequentially selecting, according to a selection signal sel, one of outputs from the N-number of parallel delays 421~42N, and simultaneously feedbacking the selected value to the adder 410 and outputting the value to the output unit 500. It is assumed that each of the N-number of delays 421~42N receives only an input signal at a rising edge of a clock and outputs the signal through an output terminal, and tends to maintain its original state. Examples of the clocks inputted to the clock terminals of the N-number of delays 421~42N include clk1~clk (N−1), and clk. Here, a clock period represents a symbol time, and clk1 represents a delayed clk by 1/N period. In like manner, clk3 represents delayed clk by 3/N period, and clk(N−1) is a delayed clk by (N−1)/N period.

The output unit 500 includes a multiplier 510 for multiplying a data value that is sequentially and selectively outputted form the first data input unit 100 by an updated coefficient that is sequentially selectively outputted from the coefficient update unit 400; and N-number of parallel delays 521~52N−1, each operating synchronously with a clock signal clk1~clkN−1 with a phase difference of 1/N period, and storing the multiplication result of the multiplier 510. Again it is assumed that each of the N-number of delays 521~52N−1 receives only an input signal at a rising edge of a clock and outputs the signal through an output terminal, and tends to maintain its original state. Examples of the clocks inputted to the clock terminals of the N-number of delays 521~52N−1 include clk1~clk (N−1). As aforementioned, a clock period represents a symbol time, and clk1 represents a delayed clk by 1/N period.

Also, the identical selection signal sel is inputted to the first and the second data input unit 100, 200, each of the selection parts 120, 220, and the selection part 430 of the coefficient update unit 400, respectively. The selection signal sel is generated sequentially by dividing a symbol time by the number of taps (N). That is to say, N-number of selection signals sel are produced within a symbol time.

Figure 3:
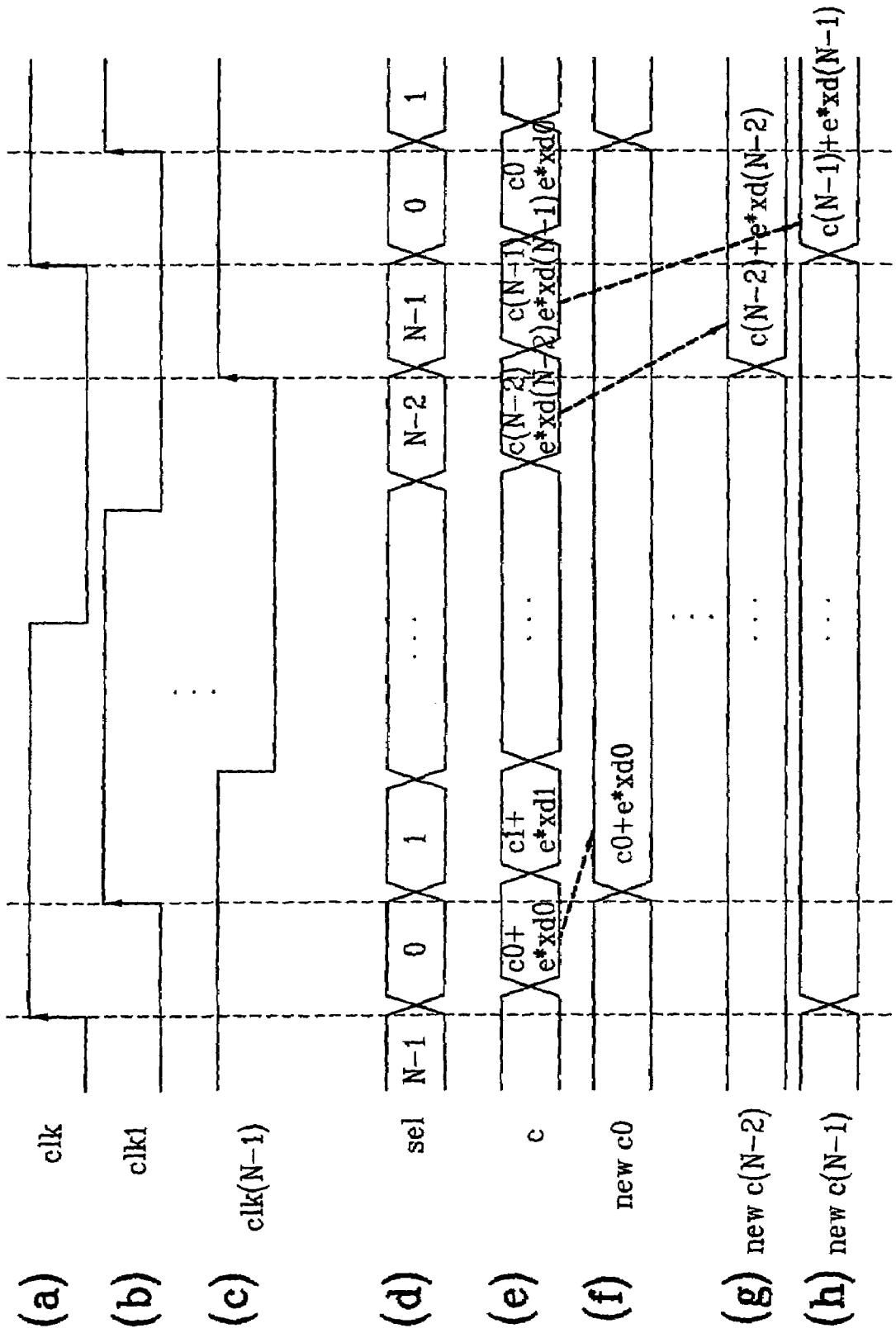
FIG. 3 illustrates operation timing diagrams of a procedure for updating coefficients in the N-tap digital filter of FIG. 2.

FIG. 3 illustrate operation timing diagrams depicting the relation between clocks clk, clk1~clk(N−1), the selection signal sel, and a procedure for updating coefficients in the LMS adaptive filter. As shown in the drawings, a new coefficient (c) is calculated sequentially according to the selection signal sel, and the new coefficient is synchronized to a clock signal clk, clk, . . . , and clk(N−1) with a phase difference by 1/N period, and stored in each of the delays 421~42N as new c0, new c1, . . . , and newc(N−1).

Figure 4:
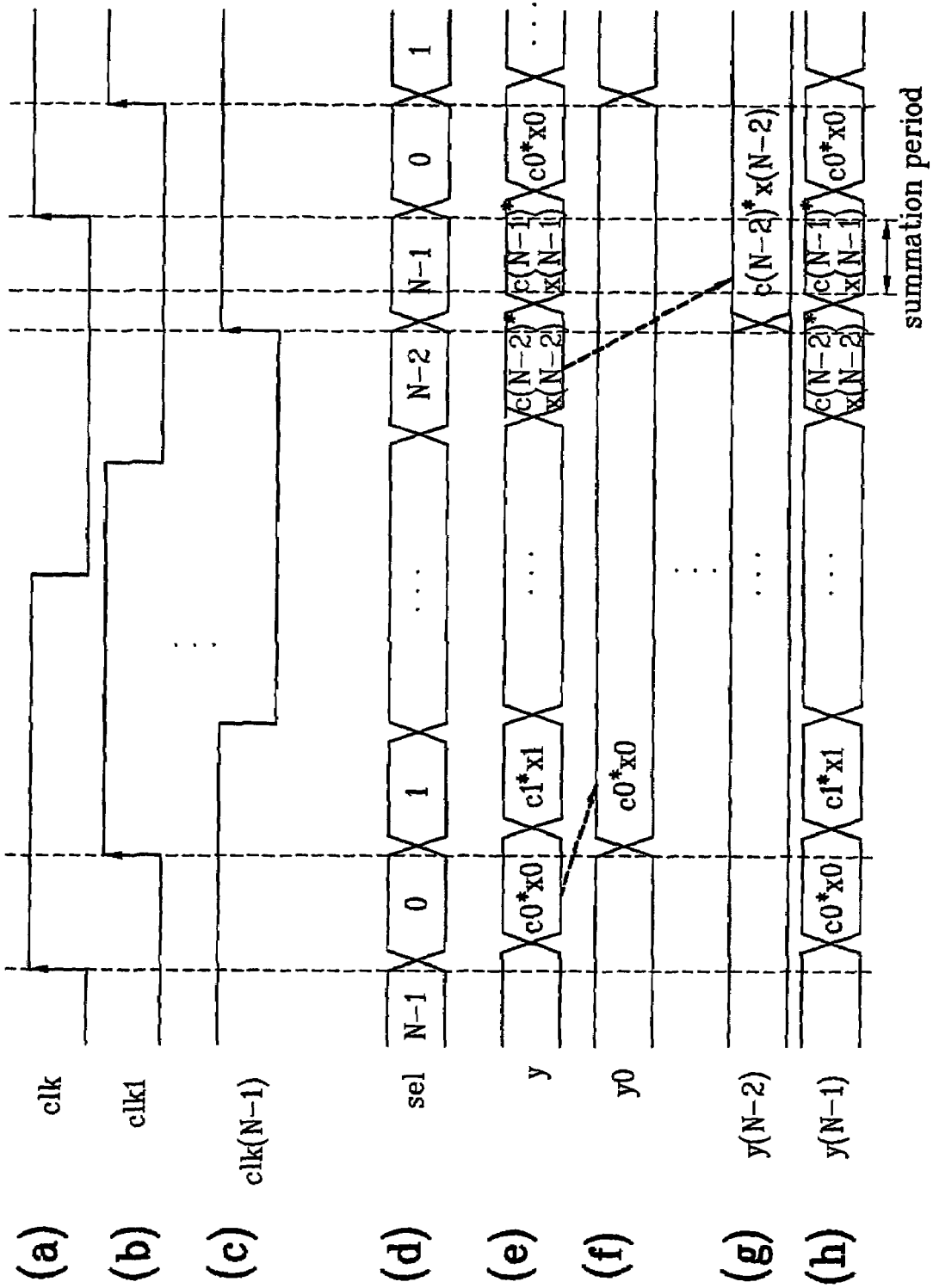
FIG. 4 illustrates operation timing diagrams of a filter output procedure in the N-tap digital filter of FIG. 2.

FIG. 4 illustrate operation timing diagrams depicting the relation between clocks clk, clk1~clk(N−1), the selection signal sel, and output signals.

According to the digital filter of the present invention, a total of N+1 signals (from the input signal x0 to xN) are selectively outputted, according to the selection signal sel, from the selection part 120 of the first data input unit 100, and a total of N+1 signals (from the delayed input signal xd0 for coefficient update to xdN) are selectively outputted, according to the selection signal sel, from the selection part 220 of the second data input unit 200. At this time, each of the signals is transferred to the selection parts 120, 220, respectively, through the delays 111~11N, 211~21N operating synchronously with the clock signal clk. In other words, the period of a clock signal clk is equal to a symbol time.

The signals which are selectively outputted from the first data input unit 100 are outputted to the multiplier 510 of the output unit 500. Also, the signals which are selectively outputted from the second data input unit 200 are outputted to the multiplier 300.

In the multiplier 300 the output data from the second data input unit 200 are multiplied by an error value (e), and the multiplication result is outputted to the adder 410 of the coefficient update unit 400. As such, even though the related art filter required multipliers as many as filter taps, the present invention filter shares a single multiplier 300 regardless of the number of taps available. Here, the error value (e) remains the same for a symbol time.

The adder 410 of the coefficient update unit 400 adds the output of the multiplier 300 to an old feedback coefficient for coefficient update, and outputs the new coefficient to each of the parallel delays 421~42N. The updated coefficients are stored in the delays 421~42N that are activated by corresponding clock signals (clk, clk1~clkN−1).

In other words, the delays 421~42N are designed to operate synchronously with clocks (clk1~clkN−1, clk) that are delayed from clk by 1/N period in sequence with respect to N-number of coefficients (c0~c(N−1)). Updated coefficients through the adder 410 are activated by corresponding clocks and stored in the delays, respectively. Here, clk1 represents a delayed clk by 1/N period, clk2 represents delayed clk by 2/N period, and clk(N−1) is a delayed clk by (N−1)/N period. The rest of the clocks are delayed likewise.

For example, suppose the selection part 220 of the second data input unit 200 outputs a delayed input signal xd0 that was delayed by the same selection signal (i.e., sel=0) as in FIG. 3(*d*). This delayed input signal xd0 is then multiplied, at the multiplier 300, by the error value (e) and outputted to the adder 410 of the coefficient update unit 400. The adder 410 of the coefficient update unit 400 adds an old feedback coefficient to the output value (=e*xd0) of the multiplier 300, thereby updating the coefficient. At this time, the old coefficient which is feedbacked to the adder 410 becomes co by the selection signal (i.e., sel=0) inputted to the selection part 430 of the coefficient update unit 400. Thus, the new coefficient outputted from the adder 410 becomes co$^+$e*xd0 as in FIG. 3(*e*).

The updated coefficient co$^+$e*xd0 is outputted simultaneously to those N-number of parallel delays 421~42N. However, the N-number of delays 421~42N are designed to be activated at a rising edge only. In addition, different clock signals are inputted to the delays 421~42N, respectively. This means that the new coefficient is stored only in the delays which are activated when the updated coefficient co$^+$e*xd0 is outputted.

Referring back to FIG. 2, clk1 is inputted to the first delay 421, where the clk1 as shown in FIG. 3(*b*) is a delayed clk by 1/N period.

As such, when the updated coefficient co$^+$e*xd0 is outputted only the first delay 421 is activated at a rising edge of the clk1, and stores the coefficient co$^+$e*xd0 therein and at the same time outputs the coefficient co$^+$e*xd0 to the multiplier 510 of the output unit 500 through the selection part 430. Then the selection signal sel inputted to each selection part 120, 220, 430 is changed to sel=0 as shown in FIG. 3(*d*). Hence, the selection part 430 selects a second old coefficient c1 and feedbacks the c1 to the adder 410. As illustrated in FIG. 3(*f*) the first delay 421 maintains the input coefficient co$^+$e*xd0 until a next rising edge of the clk1. In the course of this operation, the rest of the delays 422~42N remain inactive, none of them receiving the new input co$^+$e*xd0.

The multiplier 510 of the output unit 500 multiplies the updated coefficient that is selectively outputted from the selection part 430 of the coefficient update unit 400 by the output data from the first data input unit 100, and outputs the multiplication result to the N-1 parallel delays 521~52N−1. More specifically speaking, the multiplier 510 multiplies the updated coefficient co$^+$e*xd0 outputted from the coefficient update unit 400 by the input signal x0 that is selectively outputted from the selection part 120 of the first data input unit 100 according to the selection signal (i.e., sel=0), and outputs the multiplication result to each of the delays 521~52N−1. As described before, the delays 521~52N−1 are designed to be activated at a rising edge only. In addition, different clock signals are inputted to the delays 521~52N−1, respectively. This means that the multiplication result is stored only in the delays which are activated when the multiplication result is outputted from the multiplier 510.

Here, the clock inputted to the first delay 521 among the delays 521~52N−1 is clk1 as shown in FIG. 4(B). Therefore, the multiplication result y=co*x0 from the multiplier 510 is inputted and stored only in the first delay 521 that is activated at a rising edge of the clk1 as shown in FIG. 4(f), and at the same time outputted through the output terminal. As depicted in FIG. 4(f) the first delay 521 maintains the input value y~co*x0 until a next rising edge of the clk1. In the course of this operation, the rest of the delays 522~52N−1 remain inactive, none of them receiving the multiplication result y=co*x0 from the multiplier 510.

Accordingly, as illustrated in FIG. 4(e), the filter output is sequentially generated through the multiplication (performed by the multiplier 510) of the input signal from the first data input unit 100 and the coefficient from the coefficient update unit 400. A first output y0 is stored in the delay 521 operating synchronously with the clk1, the delayed clk by 1/N period, and outputted at the same time. In like manner, a second output y1 is stored in the delay 522 operating synchronously with the clk2, the delayed clk by 2/N period, and outputted at the same time; and an (N−1)th output y(N−2) is stored in the delay 52N−1 operating synchronously with the clk(N−1), the delayed clk by (N−1)/N period, and outputted at the same time. The rest of outputs are stored likewise, except for the N-th output y(N−1) whose delayless value is outputted from the output unit 500 as it is.

Each output y0~yN−1 for an N tap, therefore, can be calculated within the clk, and if the summation of all filter outputs is outputted prior to the next clk it is possible to get the total output of the filter within the clk when the input signal is received. In other words, as shown in FIG. 4(h), in the summation period prior to the clk, N-tap filter outputs are produced at the same time. If the outputs of every tap are summed up for the summation period, it becomes possible to get the total output of the filter within the clk when the input signal is received. As for the summation an adder (not shown) can be utilized to add the outputs y0~y(N−2) of the N−1 delays 521~52N−1 and the delayless N-th output y(N−1).

In conclusion, according to the present invention digital filter and digital broadcasting receiver having the same, a single multiplier and a single adder are shared regardless of the number of filter taps to perform coefficient update for each tap, whereby the number of operations is much reduced and the filter output can be obtained within the clk. Thus, the digital filter of the present invention can be very advantageously used for multi-tap filters.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A digital filter, comprising:
   a first data input unit for sequentially delaying input data for a clock period, and sequentially and selectively outputting one of the input data and delay values for the calculation of a filter output value;
   a second data input unit for sequentially delaying a delayed input data for a clock period, and sequentially and selectively outputting one of the input data and delay values for coefficient update;
   a multiplier for multiplying the data value that is sequentially and selectively outputted from the second data input unit by an error value;
   a coefficient update unit for sequentially updating a coefficient by adding an output from the multiplier to an old feedback coefficient, storing updated coefficients in each delay that operates synchronously with a clock signal with a phase difference of 1/N period (N is the number of filter taps), and feedbacking a sequentially selected updated coefficient as the old coefficient; and
   an output unit for multiplying updated coefficients sequentially and selectively outputted from the coefficient update unit by data sequentially and selectively outputted from the first data input unit, storing in each delay which operates synchronously with a clock signal with a phase difference of 1/N period, adding all outputs from the delays for a predetermined summation period, and outputting the summed value.

2. The digital filter according to claim 1, wherein the clock period signal is a symbol clock with a clock period.

3. The digital filter according to claim 1, wherein the input data to the second data input unit is delayed from the input data to the first data input unit by at least a symbol clock.

4. The digital filter according to claim 1, wherein the first data input unit is comprised of:
   N-number of serial delays for synchronizing the input data with the clock period signal and sequentially delaying the data;
   a selection part for sequentially selecting, according to a selection signal sel, one of the input data x0 and delay values that are delayed respectively by the N-number of delays, and outputting the selected value to the output unit.

5. The digital filter according to claim 1, wherein the second data input unit is comprised of:
   N-number of serial delays for synchronizing the delayed input data xd0 with the clock period signal and sequentially delaying the data;
   a selection part for sequentially selecting, according to a selection signal sel, one of the delayed input data x0 and delay values that are delayed respectively by the N-number of delays, and outputting the selected value to the output unit.

6. The digital filter according to claim 1, wherein the coefficient update unit is comprised of:
   an adder for adding an output from the multiplier to an old feedback coefficient and thereby, updating the old coefficient;
   N-number of parallel delays, each operating synchronously with a clock signal(clk1~clkN−1, clk) with a phase difference of 1/N period and storing the updated coefficient; and
   a selection part for sequentially selecting, according to a selection signal sel, one of outputs from the N-number of parallel delays, and simultaneously feedbacking the selected value to the adder and outputting the value to the output unit.

7. The digital filter according to one of claims 4 to 6, wherein the delays store and output simultaneously the input signal only at a rising edge of a corresponding clock with a clock period, and maintain previous states otherwise without receiving the input signal.

8. The digital filter according to one of claim 4 to 6, wherein the selection signal is a signal that is sequentially generated by diving the clk by the number of taps (N).

9. The digital filter according to claim 1, wherein the output unit is comprises:
   a multiplier for multiplying a data value that is sequentially and selectively outputted form the first data input unit by an updated coefficient that is sequentially selectively outputted from the coefficient update unit;
   N-number of parallel delays, each operating synchronously with a clock signal(clk1~clkN−1) with a phase difference of 1/N period, and storing and outputting the multiplication result of the multiplier; and
   an adder for adding, for the predetermined summation period, outputs from the (N−1)-number of delays and a N-th output value outputted without delay and thereby, obtaining a final output.

10. A digital broadcasting receiver having a digital filter, wherein the digital filter is comprised of:
    a first data input unit for sequentially delaying input data sequentially for a clock period, and sequentially and selectively outputting one of the input data and delay values for the calculation of a filter output value;
    delays for delay the input data by at least a clock period;
    a second data input unit for sequentially delaying a delayed input data for a clock period, and sequentially and selectively outputting one of the input data and delay values for coefficient update;
    a shared multiplier for multiplying the data value that is sequentially and selectively outputted from the second data input unit by an error value;
    a coefficient update unit for sequentially updating a coefficient by adding an output from the shared multiplier to an old feedback coefficient, storing updated coefficients in each delay that operates synchronously with a clock signal with a phase difference of 1/N period (N is the number of filter taps), and feedbacking a sequentially selected updated coefficient as the old coefficient; and
    an output unit for multiplying updated coefficients sequentially and selectively outputted from the coefficient update unit by data sequentially and selectively outputted from the first data input unit, storing in each delay which operates synchronously with a clock signal with a phase difference of 1/N period, adding all outputs from the delays for a predetermined summation period, and outputting the summed value.

11. The digital broadcasting receiver according to claim 10, wherein the clock period signal is a symbol clock with a clock period.

12. The digital broadcasting receiver according to claim 10, wherein the first data input unit is comprised of:
    N-number of serial delays for synchronizing the input data with the clock period signal and sequentially delaying the data;
    a selection part for sequentially selecting, according to a selection signal sel, one of the input data x0 and delay values that are delayed respectively by the N-number of delays, and outputting the selected value to the output unit.

13. The digital broadcasting receiver according to claim 10, wherein the second data input unit is comprised of:
    N-number of serial delays for synchronizing the delayed input data xd0 with the clock period signal and sequentially delaying the data;
    a selection part for sequentially selecting, according to a selection signal sel, one of the delayed input data x0 and delay values that are delayed respectively by the N-number of delays, and outputting the selected value to the output unit.

14. The digital broadcasting receiver according to claim 10, wherein the coefficient update unit is comprised of:
    an adder for adding an output from the multiplier to an old feedback coefficient and thereby, updating the old coefficient;
    N-number of parallel delays, each operating synchronously with a clock signal(clk1~clkN−1, clk) with a phase difference of 1/N period and storing the updated coefficient; and
    a selection part for sequentially selecting, according to a selection signal sel, one of outputs from the N-number of parallel delays, and simultaneously feedbacking the selected value to the adder and outputting the value to the output unit.

15. The digital broadcasting receiver according to one of claims 12 to 14, wherein the delays store and output simultaneously the input signal only at a rising edge of a corresponding clock with a clock period, and maintain previous states otherwise without receiving the input signal.

16. The digital broadcasting receiver according to one of claims 12 to 14, wherein the selection signal is a signal that is sequentially generated by diving the clock period signal by the number of taps (N).

17. The digital broadcasting receiver according to claim 10, wherein the output unit is comprises:
    a multiplier for multiplying a data value that is sequentially and selectively outputted form the first data input unit by an updated coefficient that is sequentially selectively outputted from the coefficient update unit;
    N-number of parallel delays, each operating synchronously with a clock signal clk1~clkN−1 with a phase difference of 1/N period, and storing and outputting the multiplication result of the multiplier; and
    an adder for adding, for the predetermined summation period, outputs from the (N−1)-number of delays and a N-th output value outputted without delay and thereby, obtaining a final output.

18. The digital broadcasting receiver according to claim 17, wherein the summation period is set at the end of the clock signal used for the coefficient update operation.

* * * * *